United States Patent
Ueda et al.

[11] Patent Number: 5,277,867
[45] Date of Patent: Jan. 11, 1994

[54] METHOD FOR MAKING HIGH STRENGTH INJECTION MOLDED FERROUS MATERIAL

[75] Inventors: Koshiro Ueda; Hiroshi Sawaguchi; Tohru Kohno, all of Omiya, Japan

[73] Assignee: Mitsubishi Materials Corporation, Tokyo, Japan

[21] Appl. No.: 914,856

[22] Filed: Jul. 15, 1992

[30] Foreign Application Priority Data

Jul. 15, 1991 [JP] Japan ................... 3-200113

[51] Int. Cl.$^5$ ............... B22F 3/10; B22F 3/22
[52] U.S. Cl. ............................. 419/54; 419/65
[58] Field of Search ........................... 419/54, 65

[56] References Cited

U.S. PATENT DOCUMENTS

| | | | |
|---|---|---|---|
| 3,411,902 | 11/1968 | Krock et al. | 75/208 |
| 4,492,671 | 1/1985 | Ruano et al. | 419/48 |
| 4,826,546 | 5/1989 | Yamamoto et al. | 419/29 X |
| 4,867,943 | 9/1989 | Kiyota | 419/23 |
| 4,885,133 | 12/1989 | Fujii | 419/29 |

FOREIGN PATENT DOCUMENTS

| | | | |
|---|---|---|---|
| 0324122 | 7/1989 | European Pat. Off. | B22F 3/22 |
| 0379583 | 8/1990 | European Pat. Off. | C22C 1/04 |
| 0379777 | 8/1990 | European Pat. Off. | B22F 3/10 |

OTHER PUBLICATIONS

Derwent Publications Ltd., London, GB; AN 91-159582 & JP-A-3 094 045 (Brother Ind KK) Apr. 18, 1991.

*Primary Examiner*—Peter A. Nelson
*Attorney, Agent, or Firm*—Scully, Scott, Murphy & Presser

[57] ABSTRACT

The present invention presents a method of processing ferrous powder materials to produce high strength small component parts suitable for use in miniaturized electrical and electronic equipment. The processing steps involve, in part, mixing with a binder, dewaxing or presintering at a temperature higher than in the conventional dewaxing process, and final sintering at a temperature lower than the conventional sintering process to produce parts having density values of over 96% theoretical density and high mechanical strength properties in a shorter sintering time than the conventional processing method.

1 Claim, No Drawings

METHOD FOR MAKING HIGH STRENGTH INJECTION MOLDED FERROUS MATERIAL

BACKGROUND OF THE INVENTION

This invention relates to a processing method of making injection molded ferrous component parts having high strength by a two stage sintering process. The invented processing method is particularly suitable for making small component parts for miniaturized electrical and electronic equipment.

Injection molding of ferrous powders is a known art. For example, a carbonyl iron powder of less than 15 μm average particle diameter is mixed with 8-15 weight % of a thermoplastic resin binder. This mixture is kneaded in a kneader at 135° C. for three hours, and the mixture is then cooled to room temperature, followed by further granulation in the kneader to obtain feed particles of about 1-5 mm diameter for injection molding.

These particles at temperatures of 130°-140° C. are injection molded at an injection pressure of 500-700 kgf/cm$^2$ at injection cycle times of 20-40 seconds.

The injected parts are then dewaxed at 300°-500° C., in a reducing atmosphere, such as in hydrogen, and this processing is terminated while the parts still retain about 10-20 weight % of the binder so that the dewaxed parts can retain the shape properly.

Dewaxing step is followed by further heating at 1100°-1400° C. to remove the remaining binder and to sinter the material in a hydrogen atmosphere, for example, to obtain the final sintered density of 50-70 % of the theoretical density. It is known that this high temperature dewaxing operation is time consuming (10-20 hours) and that the parts made by such a process are used as structural components in various electrical and electronic equipment.

The recent trends toward energy efficiency and light weight has promoted miniaturization of components and equipment in industries, and the demands for small thin walled structural components have increased. But the small components made by the conventional methods did not have sufficient strength to meet such requirements of the products.

The present invention resulted from extensive studies by the inventors to solve such problems of low strength and other problems associated with the conventional processing methods.

The inventors confirmed that the conventional dewaxing, in which the parts are heated at 300°-500° C., and the heating is terminated while fairly high amount of binder is still left in the molded parts (so as to maintain the shape), produces low density parts. They found that high density molded parts are obtained when dewaxing is carried out at a temperature range of 680°-750° C., higher than in the conventional method, to remove almost all the binder. At this stage, the carbon content of the dewaxed part becomes 0.05 weight %, and the theoretical density of the parts is about 60-70 %. The parts are then sintered at relatively low temperatures in the range of 870°-910° C., compared with the conventional sintering temperature of 1100°-1400° C. By this processing method, it is now possible to obtain parts having density values in the range of 96-99 % theoretical density in about 1-5 hours of sintering, in contrast to the conventional processing method involving long hours of heating to attain 90-95 % theoretical density.

SUMMARY OF THE INVENTION

The present invention is based on the results of the study as presented above, and the invented processing method to produce high strength injection molded parts comprises the following steps:

(a) pure iron powder is hot mixed with 8-15 weight % of a thermoplastic binder, and after cooling the mixture to room temperature, the mixture is subjected to a granulation step, and the powdered particles are formed into molded parts by injection molding;

(b) the molded parts are dewaxed at a temperature between 680°-750° C. until the carbon content becomes less than 0.05 weight %;

(c) the parts are then sintered at a relatively low temperature between 870°-910° C., thereby obtaining high strength injection molded iron parts.

The reasons for choosing the range of various operating parameters are outlined in the following.

(1) Binder Proportion—When the proportion of the binder is less than 8 weight %, it becomes difficult to perform injection molding, and when this value exceeds 15 weight %, it becomes difficult to produce parts having a value of theoretical density higher than 96%, and the desired strength is not achieved. For such reasons, the proportion of the binder was chosen to be between 8-15 %.

(2) Dewaxing Temperature—When the dewaxing temperature is less than 680° C., presintering is insufficient, and not only the shape retention becomes difficult, but the necessary dewaxing period is prolonged. On the other hand, when the temperature exceeds 750° C., it is not possible to obtain theoretical density of over 96% after the final sintering process. For such reasons, dewaxing temperature was chosen to be between 680°-750° C.

(3) Carbon Content of the Presintered Part—The theoretical density of the parts becomes higher as the carbon content therein is decreased. When the carbon content exceeds 0.05 weight %, the sintered density becomes less than 96% theoretical density, and it is not possible to attain high strength part. For such reasons, the carbon content was chosen to be less than 0.05 weight %.

(4) Sintering Temperature—When the sintering temperature is less than 870° C., not only the degree of sintering achieved is insufficient, but also the sintered density is low. On the other hand, when the sintering temperature exceeds 910° C., the desired density cannot be obtained to produce high strength. For these reason, the sintering temperature was chosen to be 870°-910° C.

PREFERRED EMBODIMENT

The present invention is demonstrated in a preferred embodiment in which the invented method is applied to process parts made of pure iron powders.

Carbonyl iron powders having the average particle diameters shown in Table 1 were mixed with a thermoplastic binder consisting primarily of an ethylene-vinyl acetate copolymer and paraffin wax in the proportion shown in Table 1. The mixtures were hot mixed in a kneader for 3 hours at 135° C., ground in the kneader at room temperature to obtain a feed particle mix having a particle distribution primarily in the range of 1-5 mm. The particles were molded into test parts by using a regular injection molding machine to produce test parts measuring 30 mm × 40 mm × 1.5 mm thickness at a pressure of 600 kgf/cm², a feed particle temperature of 140° C., an injection cycle timing of 30 seconds/cycle. Dewaxing treatment, i.e. presintering, was carried out as shown in Table 1 to produce dewaxed test parts (i.e. presintered parts), having carbon and theoretical density values as shown in Table 1. The presintered parts were subjected to the final sintering treatment to produce the test parts of the present invention P1-P5 of the first embodiment. For comparative purposes, the conventional processing was applied to produce test parts C1-C5 in Table 1.

Table 2 shows the results of density and strength measurements for the various test parts of the present invention and comparative process.

The results of this embodiment demonstrated that the pure iron parts produced by the invented method have higher density values, as well as higher strength values as represented by examples P1-P5, compared with the parts produced by the conventional processing method represented by the comparative examples C1-C5.

Therefore, it has been demonstrated that the invented method enables the production of high strength injection molded parts, thereby contributing greatly to the production technology for thin-walled components parts to enable manufacturing of energy-efficient and light weight and miniature component parts for use in various electrical and electronic equipment.

TABLE 1

| Ex. No. | Av D (μm) | Composition | | Dewaxing | | |
|---|---|---|---|---|---|---|
| | | Fe (w/o) | Binder (w/o) | Atm | Temp (°C.) | Holding Time (hrs) |
| P1 | 15 | 90 | 10 | H₂ | 680 | 5 |
| P2 | 12 | 92 | 8 | H₂ + Ar | 710 | 2 |
| P3 | 6 | 85 | 15 | H₂ + N₂ | 750 | 1 |
| P4 | 9 | 91 | 9 | H₂ | 710 | 3 |
| P5 | 4 | 92 | 8 | H₂ | 710 | 5 |
| C1 | 15 | 90 | 10 | H₂ | 300 | 5 |
| C2 | 7 | 92 | 8 | H₂ + Ar | 400 | 5 |
| C3 | 4 | 85 | 15 | H₂ + N₂ | 500 | 5 |
| C4 | 8 | 91 | 9 | H₂ | 400 | 5 |
| C5 | 6 | 88 | 12 | H₂ | 400 | 5 |

| Ex No. | Presintering | | Final Sintering | | |
|---|---|---|---|---|---|
| | Den (%) | Carbon (w/o) | Atm | Temp (°C.) | Holding Time (hrs) |
| P1 | 60 | 0.046 | H₂ + Ar | 900 | 1 |
| P2 | 62 | 0.034 | H₂ | 900 | 3 |
| P3 | 64 | 0.006 | H₂ | 900 | 5 |
| P4 | 60 | 0.020 | H₂ + N₂ | 870 | 3 |
| P5 | 61 | 0.007 | H₂ | 910 | 5 |
| C1 | 63 | 1.5 | H₂ + N₂ | 1250 | 20 |

TABLE 1-continued

| Ex. No. | Av D (μm) | Composition | | Dewaxing | | |
|---|---|---|---|---|---|---|
| | | Fe (w/o) | Binder (w/o) | Atm | Temp (°C.) | Holding Time (hrs) |
| C2 | 62 | 1.2 | | H₂ | 1250 | 15 |
| C3 | 62 | 0.9 | | H₂ + Ar | 1250 | 10 |
| C4 | 62 | 1.2 | | H₂ | 1100 | 10 |
| C5 | 62 | 1.2 | | H₂ + N₂ | 1400 | 15 |

Notes regarding Table 1:
Av D — Average diameter;
H₂ + N₂ — dissociated ammonia;
Ex — Example;
Den — Density;
H₂ + Ar — H₂ plus 10% Argon;
Atm — atmosphere

TABLE 2

| | Injection Molded Parts | |
|---|---|---|
| Present Inv. | Theoretical Density (%) | Tensile Strength (Kgf/mm²) |
| 1 | 96 | 31 |
| 2 | 97 | 31 |
| 3 | 98 | 32 |
| 4 | 96 | 30 |
| 5 | 99 | 33 |
| Conventional | | |
| 6 | 94 | 25 |
| 7 | 93 | 23 |
| 8 | 93 | 23 |
| 9 | 92 | 22 |
| 10 | 94 | 24 |

What is claimed is:

1. A processing method for making injection molded ferrous component parts having properties suitable for structural applications in small electrical and electronic equipment, said method comprising the steps of:
   (a) hot mixing a ferrous powder with a thermoplastic binder at a concentration between 8-15 weight % to produce a feed mix;
   (b) cooling said feed mix to room temperature and subjecting said feed mix to a granulation process to produce a particle mix for injection molding;
   (c) injection molding said particle mix to produce molded parts;
   (d) dewaxing said molded parts from step (c) at a temperature between 680°-750° C., to produce presintered parts containing not more than 0.05 weight % carbon produced from said binder; and
   (e) subjecting said presintered parts from step (d) to final sintering at a temperature between 870°-910° C.;

thereby producing injection molded parts having high strength suitable for use as small structural component parts in electrical and electronic equipment.

* * * * *